(12) United States Patent
Lin

(10) Patent No.: US 8,154,884 B2
(45) Date of Patent: Apr. 10, 2012

(54) ELECTRONIC DEVICE WITH ELECTROSTATIC PROTECTION STRUCTURE

(75) Inventor: Chung-Chuan Lin, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 431 days.

(21) Appl. No.: 12/423,078

(22) Filed: Apr. 14, 2009

(65) Prior Publication Data

US 2010/0053839 A1    Mar. 4, 2010

(30) Foreign Application Priority Data

Sep. 3, 2008    (CN) .......................... 2008 1 0304350

(51) Int. Cl.
*H05K 9/00* (2006.01)
(52) U.S. Cl. ...................................................... 361/818
(58) Field of Classification Search .................. 361/799, 361/800
See application file for complete search history.

(56) References Cited

U.S. PATENT DOCUMENTS

| | | | | |
|---|---|---|---|---|
| 5,029,041 A * | 7/1991 | Robinson et al. | ............. | 361/220 |
| 5,140,110 A * | 8/1992 | Nakagawa et al. | ............. | 174/250 |
| 5,557,064 A * | 9/1996 | Isern-Flecha et al. | ........ | 174/393 |
| 5,637,426 A * | 6/1997 | Uchikawa | ......................... | 430/9 |
| 5,659,245 A * | 8/1997 | Ping et al. | ................ | 324/750.05 |
| 5,969,923 A * | 10/1999 | Avery | .............................. | 361/56 |
| 6,091,082 A * | 7/2000 | Thomas et al. | .................. | 257/77 |
| 6,323,445 B1 * | 11/2001 | Yee | .................................. | 200/5 A |
| 6,330,145 B1 * | 12/2001 | Lepert et al. | ................... | 361/220 |
| 6,493,198 B1 * | 12/2002 | Arledge et al. | ................. | 361/56 |
| 6,686,546 B2 * | 2/2004 | Chiu | .......................... | 178/18.01 |
| 6,780,726 B2 * | 8/2004 | Thomas | ......................... | 438/393 |
| 6,836,397 B2 * | 12/2004 | Chen et al. | ..................... | 361/220 |
| 7,012,308 B2 * | 3/2006 | Kato et al. | ..................... | 257/360 |
| 2002/0067344 A1 * | 6/2002 | Chiu | ............................ | 345/173 |
| 2004/0146701 A1 * | 7/2004 | Taguchi | ......................... | 428/209 |
| 2005/0139987 A1 * | 6/2005 | Okada et al. | .................. | 257/700 |
| 2005/0230757 A1 * | 10/2005 | Nagasawa et al. | ............. | 257/355 |
| 2006/0227473 A1 * | 10/2006 | Inoue et al. | ..................... | 361/56 |
| 2009/0045457 A1 * | 2/2009 | Bobde | ............................ | 257/328 |
| 2010/0001363 A1 * | 1/2010 | Frye et al. | ..................... | 257/491 |
| 2010/0133557 A1 * | 6/2010 | Kwon et al. | ..................... | 257/88 |

* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

An electronic device includes a circuit board and an electrostatic protection structure. The circuit board has a top surface and a bottom surface opposite to the top surface. The electrostatic protection structure is positioned on the top surface of the circuit board. The electrostatic protection includes an insulating layer and a conducting layer coating on the insulating layer. Four ground terminals are formed on the bottom surface of the circuit board. The insulating layer includes a main portion and four first connecting portions extending from the main portion. The conducting layer on the four first connecting portion are connected to the four first ground terminal.

14 Claims, 7 Drawing Sheets

ELECTRONIC DEVICE WITH ELECTROSTATIC PROTECTION STRUCTURE

BACKGROUND

1. Technical Field

The present disclosure relates generally to electronic devices and, more particularly, to an electronic device with electrostatic protection structure.

2. Description of Related Art

Static electricity tends to accumulate on a circuit board of electronic devices. If enough static electricity is built up, the static electricity is discharged, potentially damaging the circuit board. Therefore, the circuit board generally has an electrostatic protection structure.

A typical electronic device includes a circuit board and an electrostatic protection structure. The circuit board defines a ground terminal on a top surface. The electrostatic protection structure is positioned at a side of the circuit board, and includes a non-conducting layer coated on the circuit board, a conducting layer coated on the non-conducting layer, and a connecting end connected to the ground terminal, to provide a ground path for the static electricity.

However, the circuit board only has one ground terminal to conduct static electricity. Static electricity buildup in an area of the circuit board away from the ground terminal may not be conducted immediately. But, a plurality of ground terminals on the top surface of the circuit board would increase the size of the circuit board.

Therefore, an electronic device which overcomes the above-described shortcomings is desired.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
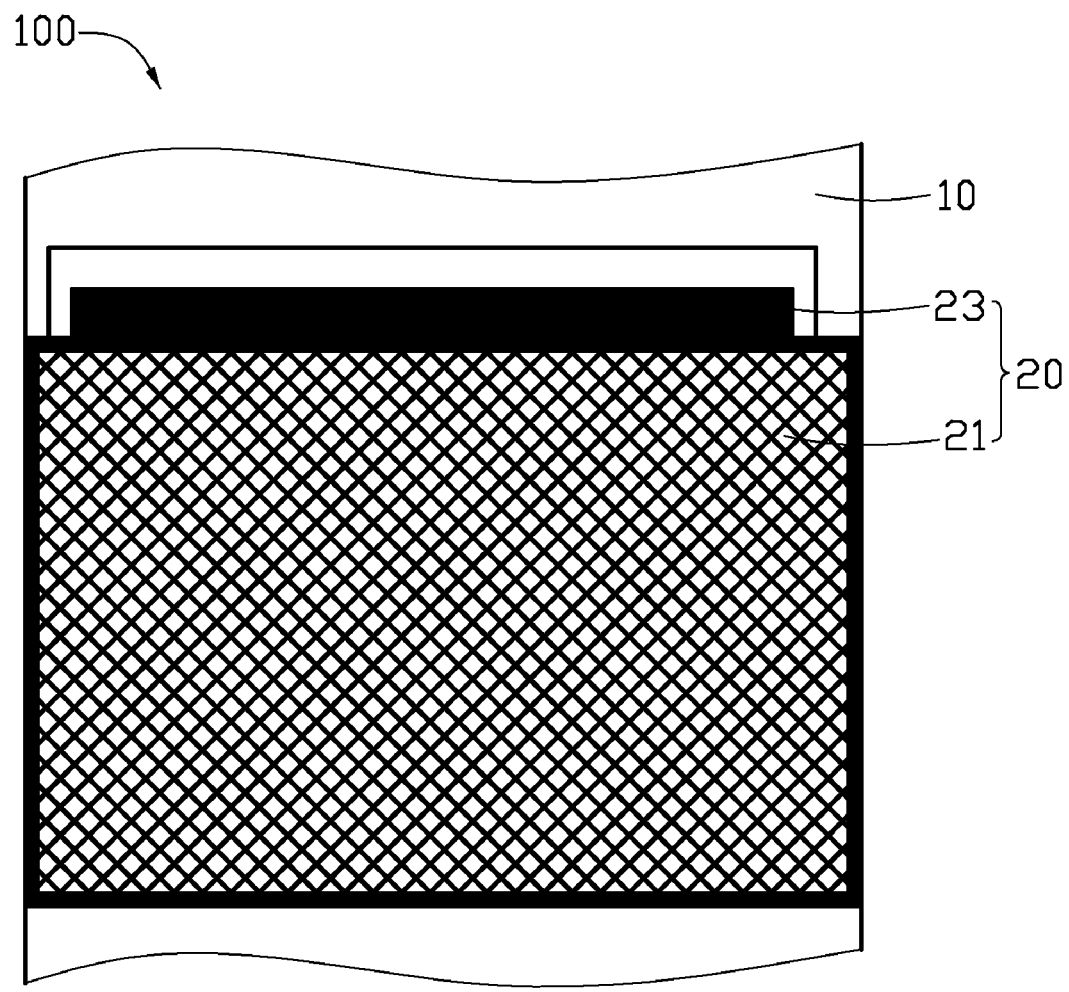
FIG. 1 is a schematic, top view of a first embodiment of an electronic device, the electronic device including a circuit board and an electrostatic protection structure, the electrostatic protection structure including an insulating layer and a conducting layer.

Referring to FIG. 1, an embodiment of an electronic device 100 includes a circuit board 10 and an electrostatic protection structure 20 positioned on the circuit board 10. The electrostatic protection structure 20 includes an insulating layer 21 and a conducting layer 23 coated on the insulating layer 21.

Figure 2:
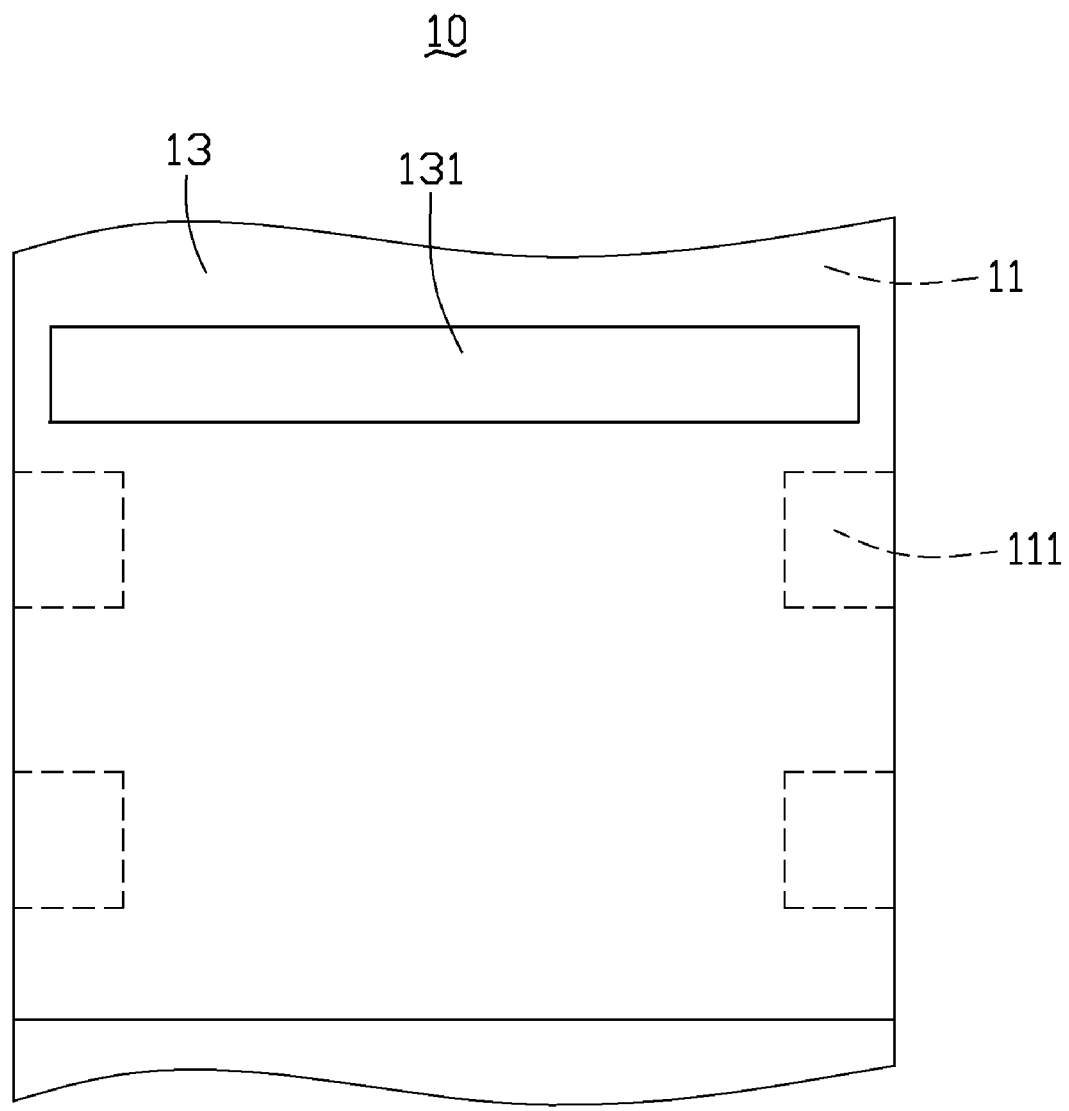
FIG. 2 is a top view of the circuit board of FIG. 1.

Referring to FIG. 2, the circuit board 10 has a top surface 13 and a bottom surface 11 on opposite sides of the circuit board 10. A plurality of electronic components (not shown) are arranged on the top surface 13. A plurality of first ground terminals 111 are formed on the bottom surface 11. In the illustrated embodiment, four first ground terminals 111 are formed on the bottom surface 11, and symmetrically arranged on opposite sides of the bottom surface 11. A second ground terminal 131 is formed on the top surface 13.

Figure 3:
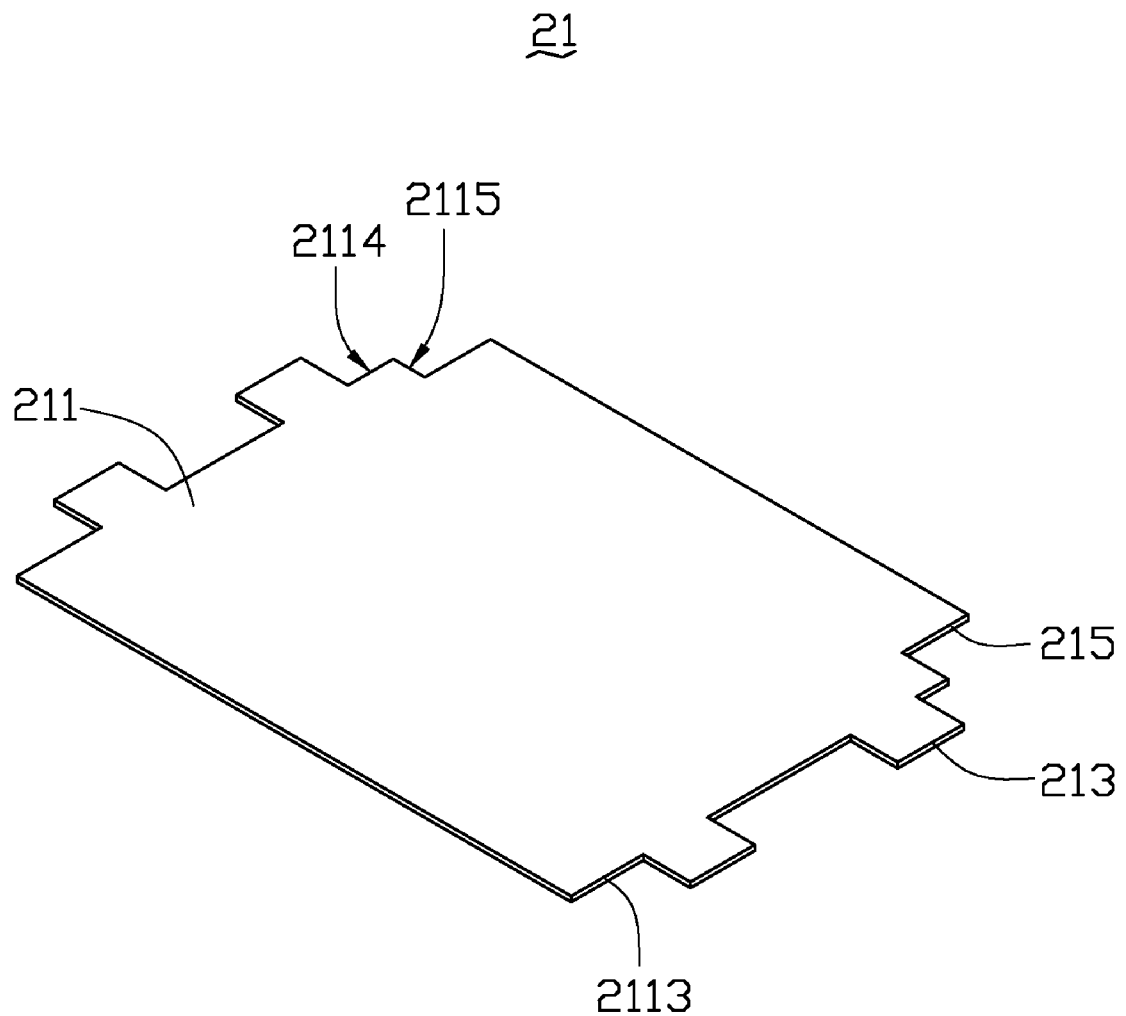
FIG. 3 is an isometric view of the insulating layer of FIG. 1, and four first connecting portions of the insulating layer being unfolded to a main portion of the insulating layer.

Referring to FIG. 3, the insulating layer 21 includes a main portion 211, a plurality of first connecting portions 213, and a second connecting portion 215. In the illustrated embodiment, the insulating layer 21 includes four first connecting portions 213. Two of the first connecting portions 213 extend from a first end 2113 of the main portion 211, and another two of the first connecting portions 213 extend from a second end 2114 of the main portion 211 opposite to the first end 2113. The second connecting portion 215 extends from a first side 2115 of the main portion 211. In the illustrated embodiment, the main portion 211, the first connecting portions 213, and the second connecting portion 215 are rectangular shaped.

Figure 4:
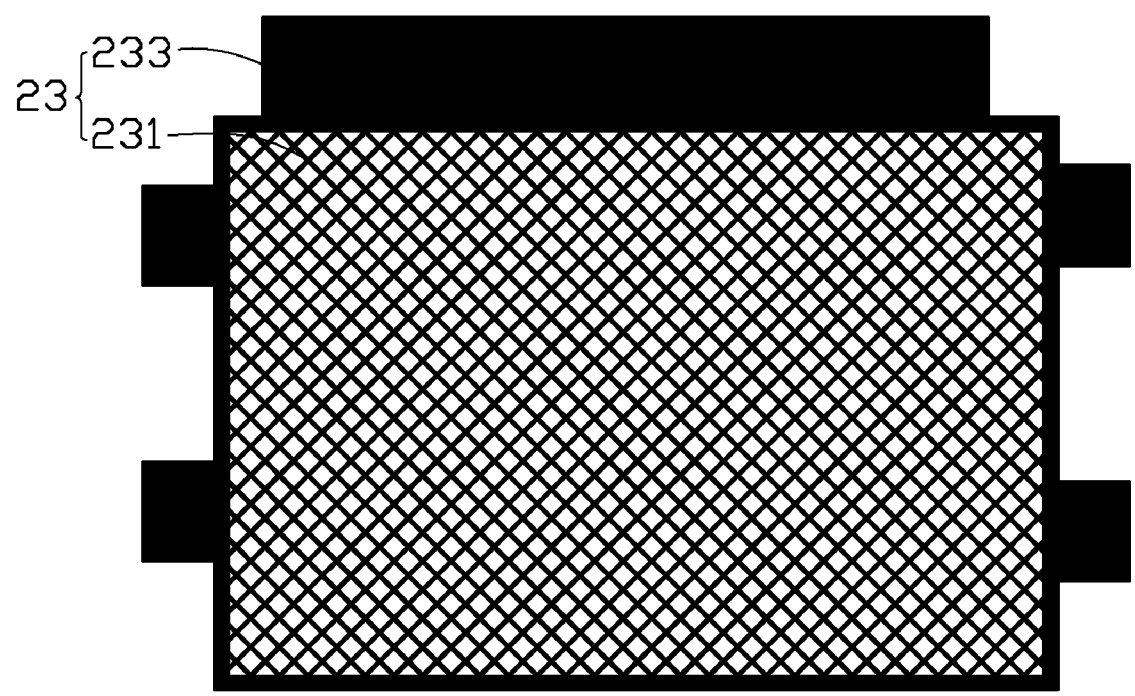
FIG. 4 is a top view of the conducting layer of FIG. 1.
Figure 5:
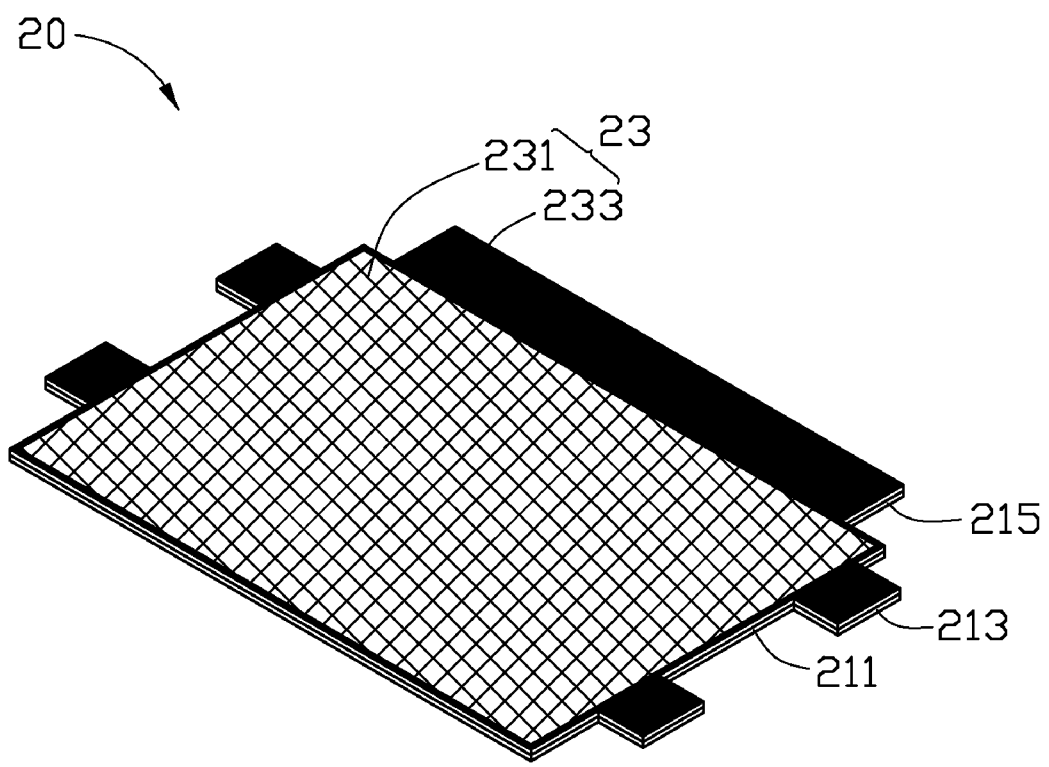
FIG. 5 is an isometric view of the electrostatic protection structure of FIG. 1, and four first connecting portions of the insulating layer unfolded to a main portion of the insulating layer.
Figure 6:
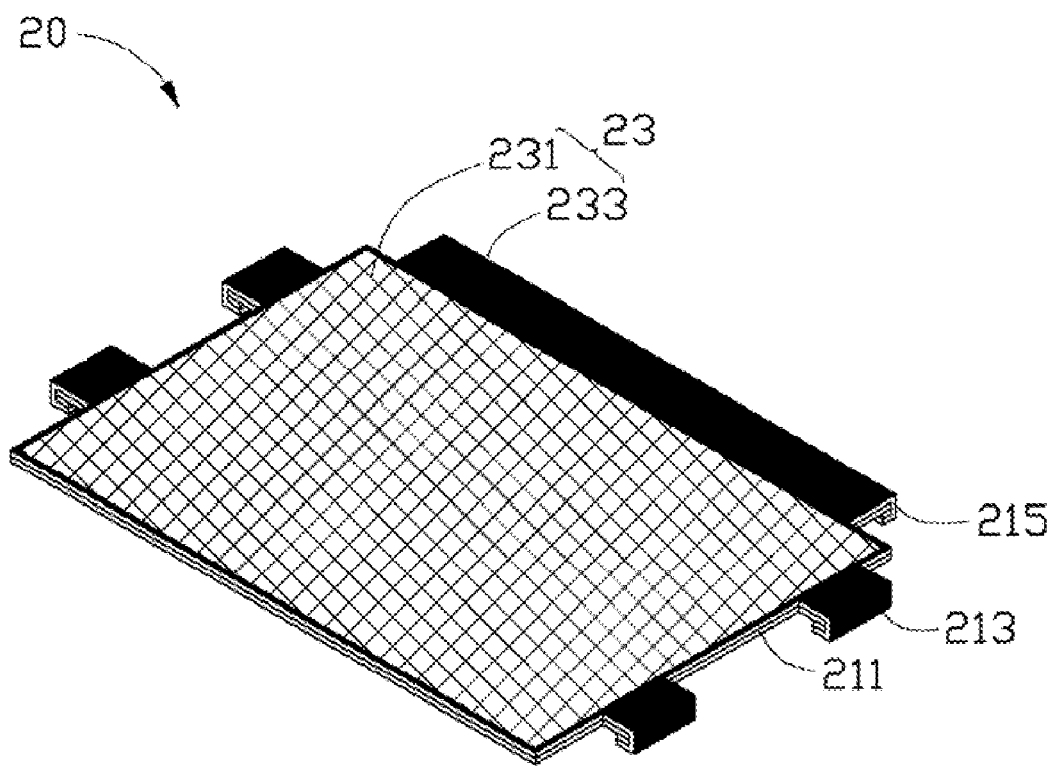
FIG. 6 is an isometric view of the insulating layer of FIG. 1, and four first connecting portions of the insulating layer being folded about 180 degrees in a direction towards a side of the insulating layer.
Figure 7:
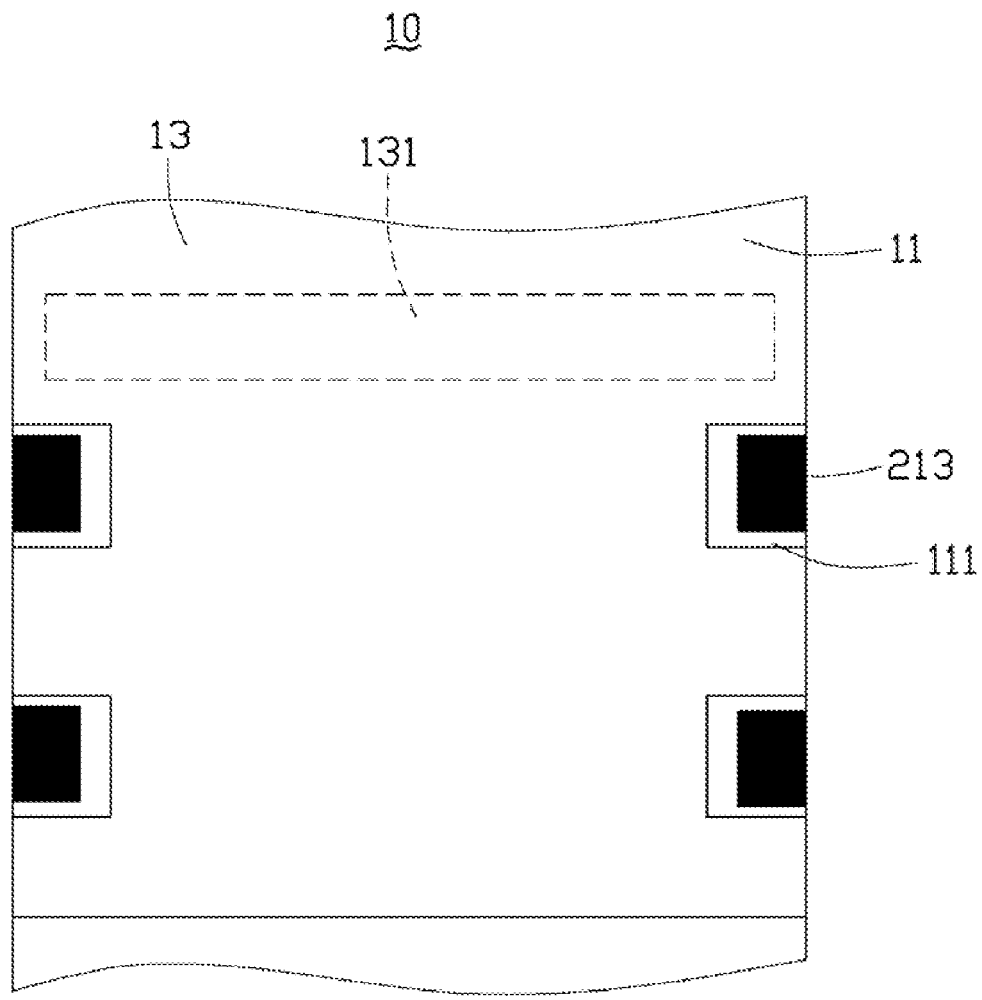
FIG. 7 is a top view of the electronic device, and four first connecting portions of the insulating layer further folded on the circuit board.

Referring to FIGS. 4 and 5, the conducting layer 23 includes a first conducting portion 231 coated on the main portion 211 and a second conducting portion 233 coated throughout the first connecting portions 213 and the second connecting portion 215. The first conducting portion 231 may be a mesh distribution. In the illustrated embodiment, the conducting layer 23 is sprayed on the insulating layer 21. Static charge accumulated on the first conducting portion 231 can be conducted by the second conducting portion 233.

Referring to FIGS. 1 through 5, in assembling the electronic device 100, insulating glue is smeared on the main portion 211 of the insulating layer 21, and the electrostatic protection structure 20 is attached to the circuit board 10 with the main portion 211 of the insulating layer 21 facing the top surface 13 of the circuit board 10. The insulating glue prevents electronic components on the circuit board 10 from short circuiting. The first connecting portions 213, the second connecting portion 215, and the second conducting portion 233 coated on the first connecting portions 213 and the second connecting portion 215, are folded about 180 degrees in a direction towards a side of the insulating layer 21, such that the second conducting portion 233 is exposed. The first connecting portions 213 and the second conducting portion 233 coated on the first connecting portions 213 are further folded over the bottom surface 11 of the circuit board 10, and attached to the first ground terminals 111 via the conducting glue. The second connecting portion 215 is connected to the second ground terminal 131 via conducting glue. The conducting glue creates a conductive path between the first connecting portions 213 and the first ground terminals 111, and between the second connecting portion 215 and the second ground terminal 131.

The first ground terminals 111 are formed on the bottom surface 11 of the circuit board 10, and the first connecting portions 213 are positioned at the bottom surface 11. Therefore, the circuit board 10 can have more ground terminals to conduct static electricity, without increasing size. Static electricity on the circuit board 10 can be conducted away efficiently, thereby avoiding damage to the electronic components by static electricity. In addition, since only one side of the circuit board 10 needs to be applied with the conducting layer 23, the electrostatic protection structure 20 can be manufactured more easily.

In an alternative embodiment, opposite surfaces of the first connecting portions 213 and the second connecting portion 215 are coated throughout by the conducting layer 23. Therefore, the first connecting portions 213 can be directly attached to the first ground terminals 111, and the second connecting portion 215 only need to be folded once, and be attached to the second ground terminal 131 via conducting glue.

It should be pointed out that, the insulating layer 21 may not include the second ground terminal 131. Therefore, the circuit board 10 can have a smaller size. The first connecting portions 213 and the second connecting portion 215 may be other shapes, such as circular shaped. In addition, the conducting layer 23 can be a plate made of conducting material, and is attached or sealed to the insulating layer 21.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
   a circuit board having a top surface and a bottom surface opposite to the top surface;
   an electrostatic protection structure positioned on the top surface of the circuit board, the electrostatic protection structure comprising an insulating layer and a conducting layer coated on the insulating layer;
   wherein at least one first ground terminal is formed on the bottom surface of the circuit board; the insulating layer comprises a main portion and at least one first connecting portion extending from the main portion; the conducting layer is coated on the main portion with a mesh distribution, the conducting layer on the at least one first connecting portion is connected to the at least one first ground terminal.

2. The electronic device of claim 1, wherein a second ground terminal is formed on the top surface of the circuit board; the insulating layer further comprises a second connecting portion; the conducting layer on the second connecting portion is connected to the second ground terminal.

3. The electronic device of claim 1, wherein the electrostatic protection structure is attached to the circuit board.

4. The electronic device of claim 3, wherein the insulating layer is attached to the circuit board via insulating glue.

5. The electronic device of claim 1, wherein the at least one first connecting portion is attached to the at least one first ground terminal via conducting glue.

6. The electronic device of claim 1, wherein the at least one first connecting portion comprises four connecting portions, each pair of connecting portions extending from opposite sides of the main portion; the at least one first a ground terminal comprises four first ground terminals formed on opposite sides of the bottom surface of the circuit board; the first connecting portions are connected to the first ground terminals.

7. The electronic device of claim 1, wherein the conducting layer is sprayed on the insulating layer.

8. The electronic device of claim 1, wherein the conducting layer is attached to the insulating layer.

9. An electronic device, comprising:
   a circuit board having a top surface and a bottom surface opposite to the top surface, wherein at least one first ground terminal formed on the bottom surface of the circuit board;
   an electrostatic protection structure positioned on the top surface of the circuit board, the electrostatic protection structure comprising an insulating layer and a conducting layer coated on the insulating layer, the insulating layer including a main portion and at least one first connecting portion, the at least one first connecting portion folded 180 degrees relative to the main portion toward the insulating layer, the folded first connecting portion further folded over the bottom surface of the circuit board to sandwich the circuit board, wherein the at least one first connecting portion is electrically connected to the at least one first ground terminal to conduct static electricity on the tops surface of the circuit board to outside.

10. The electronic device of claim 9, wherein a second ground terminal is formed on the top surface of the circuit board; the insulating layer further comprises a second connecting portion folded about 180 degrees relative to the main portion to face the top surface of the circuit board; the conducting layer on the second connecting portion is connected to the second ground terminal.

11. The electronic device of claim 9, wherein the electrostatic protection structure is attached to the circuit board.

12. The electronic device of claim 9, wherein the the main portion is attached to the circuit board via insulating glue.

13. The electronic device of claim 9, wherein the at least one first connecting portion is attached to the at least one first ground terminal via conducting glue.

14. The electronic device of claim 9, wherein the at least one first connecting portion comprises four connecting portions; the at least one first around terminal comprises four first ground terminals formed on opposite sides of the bottom surface of the circuit board; the first connecting portions are connected to the first ground terminals.

\* \* \* \* \*